United States Patent
Kinugasa

(10) Patent No.: US 6,822,501 B2
(45) Date of Patent: Nov. 23, 2004

(54) APPARATUS FOR CORRECTING OFFSET VOLTAGE

(75) Inventor: Yukihisa Kinugasa, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/695,927

(22) Filed: Oct. 30, 2003

(65) Prior Publication Data

US 2004/0178839 A1 Sep. 16, 2004

(30) Foreign Application Priority Data

Mar. 3, 2003 (JP) ........................................ 2003-056197

(51) Int. Cl.[7] .............................................. H03L 5/00
(52) U.S. Cl. ........................................... 327/307; 330/9
(58) Field of Search ................................ 327/307, 560, 327/563; 330/9

(56) References Cited

U.S. PATENT DOCUMENTS 5,821,795 A * 10/1998 Yasuda et al. .............. 327/307

FOREIGN PATENT DOCUMENTS

| JP | 11-88071 A | 3/1999 |
|---|---|---|
| JP | 2001-44770 A | 2/2001 |

OTHER PUBLICATIONS

"Neuron–MOS Current Mirror Circuit and Its Application to Multi–Valued Logic" Jing Shen et al. IEICE Trans. Inf. & Syst., vol. E82–D, No. 5 May 1999 (pp. 940–948).

* cited by examiner

Primary Examiner—Kenneth B. Wells
(74) Attorney, Agent, or Firm—Nixon Peabody LLP; Donald R. Studebaker

(57) ABSTRACT

Offset voltage correction apparatus and method correct an input offset voltage in a comparator circuit with a very high accuracy. To detect an input offset voltage in a comparator, a counter circuit performs both up-count and down-count operations on a clock signal. An offset voltage correction circuit obtains a value (counter value) of a counter signal corresponding to an input offset voltage provided at the transition in a comparison signal from "1" to "0" and a value (counter value) of the counter signal corresponding to an input offset voltage provided at the transition from "0" to "1." The offset voltage correction circuit performs a predetermined arithmetic operation using the counter values. The offset voltage in the comparator is corrected in accordance with this arithmetic operation result.

16 Claims, 11 Drawing Sheets

12 : COUNTER CIRCUIT

APPARATUS FOR CORRECTING OFFSET VOLTAGE

BACKGROUND OF THE INVENTION

1. Technical Field

The present invention relates to an offset voltage correction apparatus and an offset voltage correction method for correcting an input offset voltage in a comparator circuit.

2. Background Art

In an operational amplifier constituting a comparator circuit, an input offset voltage, which should be ideally at 0V, has a certain value due to:

(1) Variations in size of transistors located at the input stage of the operational amplifier; and (2) Temperature drift and deterioration with time.

An operational amplifier having an input offset voltage would cause the comparator circuit to deliver an unexpected signal even when signals at the same voltage level are applied to the positive phase input terminal and the negative input terminal of the operational amplifier. In particular, in such devices as operated with signals of very small amplitude, a slight variation in voltage level would exert significant effects on the circuit in a subsequent stage, thus requiring some means for correcting the input offset voltage with high accuracy.

Prior art techniques for correcting input offset voltages are disclosed in Japanese Patent Kokai No. 11-88071 (Document 1) and Japanese Patent Kokai No. 2001-44770 (Document 2).

Document 1 describes an offset voltage correction circuit comprising a counter circuit. The voltage level of an input signal at which a change occurs in the output signal from the operational amplifier is associated with a counter value of the counter circuit. The input offset voltage is corrected in accordance with this counter value. An amplifier circuit described in Document 2 comprises a comparator circuit for comparing the output voltage from the operational amplifier with a reference voltage and a level shift circuit for adjusting the input voltage to the operational amplifier in accordance with the output signal from this comparator circuit. This circuit arrangement provides a correction to the input offset voltage in the operational amplifier.

The input offset voltages each measured at a transition from "1" to "0" and from "0" to "1" in output signal using a prior art comparator circuit were found to be different from each other. That is, the measurements showed that the input offset voltages were different depending on whether the state is at "1" or "0" immediately before the change occurs in the output from the comparator circuit, the phenomenon of which is caused by the comparator circuit having a hysteresis characteristic.

In particular, in a device operated with signals of very small amplitude, it is necessary to correct the input offset voltage in the comparator circuit with higher accuracy, without neglecting the deviation in the input offset voltage as described above.

SUMMARY OF THE INVENTION

The present invention was devised in view of the aforementioned problems. It is therefore an object of the invention to provide an improved inventive method and apparatus for correcting an offset voltage, the method and apparatus enabling an input offset voltage in the comparator circuit to be corrected with very high accuracy.

To solve the aforementioned problems, according to a first aspect of the present invention, provided is an offset voltage correction apparatus having a comparator internally or externally. The comparator comprises a first internal node having a potential varied in response to a potential at a first input terminal and a second internal node having a potential varied in response to a potential at a second input terminal. The comparator compares the potential at the first internal node with the potential at the second internal node to output a comparison result as a comparison result signal. Furthermore, the offset voltage correction apparatus comprises an offset voltage detection signal output part, an offset voltage correction signal generator, and an offset voltage adjuster.

The offset voltage detection signal output part functions to sequentially convert a counter value obtained through an up-count operation and a down-count operation on a clock signal to an offset voltage detection signal to provide the offset voltage detection signal to the second input terminal of the comparator circuit having a reference signal directed to the first input terminal.

The offset voltage correction signal generator performs a predetermined arithmetic operation, using a counter value provided when a change has occurred in logic level of the comparison result signal during the up-count operation on the clock signal by the offset voltage detection signal output part and using a counter value provided when a change has occurred in logic level of the comparison result signal during the down-count operation on the clock signal by the offset voltage detection signal output part, to generate an offset voltage correction signal in accordance with an arithmetic operation result counter value obtained by the arithmetic operation.

The offset voltage adjuster adjusts the potential at the first internal node or the potential at the second internal node in accordance with the offset voltage correction signal.

According to the offset voltage correction apparatus configured as described above, during an offset correction operation, both the offset voltages are taken into consideration which appear when the potential at the first input terminal of the comparator circuit has changed from a lower level to a higher level than the potential at the second input terminal and from a higher level to a lower level than the potential at the second input terminal. Therefore, even when the comparator circuit has a hysteresis characteristic in terms of an offset voltage, the offset voltage can be corrected with high accuracy. To provide more improved correction accuracy, defined as an arithmetic operation result counter value is an average value of a counter value provided when a change has occurred in logic level of the comparison result signal during the up-count operation on the clock signal by the offset voltage detection signal output part and a counter value provided when a change has occurred in logic level of the comparison result signal during the down-count operation on the clock signal by the offset voltage detection signal output part.

A transistor can constitute the offset voltage adjuster. A first power supply terminal of the transistor is connected to a power supply node, while a second power supply terminal is connected to the first internal node or the second internal node. The offset voltage correction signal, which is directed to a control terminal, provides an ON/OFF control to the transistor.

The offset voltage adjuster can be contained in a first internal node potential control device for controlling the potential at the first internal node in response to the potential at the first input terminal. On the other hand, the offset voltage adjuster can also be contained in a second internal node potential control device for controlling the potential at the second internal node in response to the potential at the second input terminal.

In this case, the first internal node potential control device (or the second internal node potential control device) is preferably a transistor having two control terminals (e.g., a neuron MOS transistor). The voltage at the first input terminal (the second input terminal) is applied to one of the two control terminals or the first control terminal, while the offset voltage correction signal is directed to the other terminal or the second control terminal. On the other hand, the first power supply terminal of the transistor is connected to the power supply node, while the second power supply terminal is connected to the first internal node (the second internal node). This transistor can be employed to thereby reduce the circuit scale of an offset voltage corrector.

According to a second aspect of the present invention, provided is a method for correcting an offset voltage in a comparator with a first internal node having a potential varied in response to a potential at a first input terminal and with a second internal node having a potential varied in response to a potential at a second input terminal.

The comparator compares the potential at the first internal node with the potential at the second internal node to output a comparison result as a comparison result signal. This correction method comprises the following six steps.

In the first step, an up-count operation is performed on a clock signal, and the resulting count value (a digital value) is sequentially converted to an offset voltage detection signal (an analog value).

In the second step, the offset voltage detection signal obtained in the first step is continually supplied to the second input terminal of the comparator circuit. At this time, a reference signal is supplied to the first input terminal of the comparator circuit.

The up-count operation on the clock signal is stopped a predetermined period of time (at least one or more cycles of the clock signal) after a change has occurred in logic level of the comparison result signal delivered from the comparator circuit. This is the third step. Furthermore, in this third step, a down-count operation on the clock signal is started with respect to a count value provided when the up-count operation has been stopped to sequentially convert the count value obtained through the down-count operation to an offset voltage detection signal.

In the fourth step, the offset voltage detection signal obtained in the third step is continually supplied to the second input terminal of the comparator circuit having a reference signal directed to the first input terminal.

In the fifth step, performed is a predetermined arithmetic operation, using a count value provided when a change has occurred in logic level of the comparison result signal in the second step and a count value provided when a change has occurred in logic level of the comparison result signal in the fourth step, to generate an offset voltage correction signal in accordance with an arithmetic operation result counter value obtained by the arithmetic operation.

Finally, in the sixth step, the potential at the first internal node or at the second internal node is adjusted in accordance with the offset voltage correction signal.

According to the method described above, both the offset voltages can be grasped which appear when the potential at the first input terminal of the comparator circuit has changed from a lower level to a higher level than the potential at the second input terminal and from a higher level to a lower level than the potential at the second input terminal. Therefore, even when the comparator circuit has a hysteresis property in terms of an offset voltage, the offset voltage can be corrected with high accuracy. To provide more improved correction accuracy, defined as an arithmetic operation result counter value is an average value of a count value provided when a change has occurred in logic level of the comparison result signal in the second step and a count value provided when a change has occurred in logic level of the comparison result signal in the fourth step.

On the other hand, the up-count operation on the clock signal in the first step may be interchanged with the down-count operation on the clock signal in the third step.

DETAILED DESCRIPTION OF THE INVENTION

Now, the apparatus for correcting an offset voltage according to the present invention will be explained below in more detail with reference to the accompanying drawings in accordance with the embodiments. It is to be understood that where like numerals are used throughout the attached figures and the following descriptions, and such like numerals refer to those components having generally the same function and arrangement.

Figure 1:
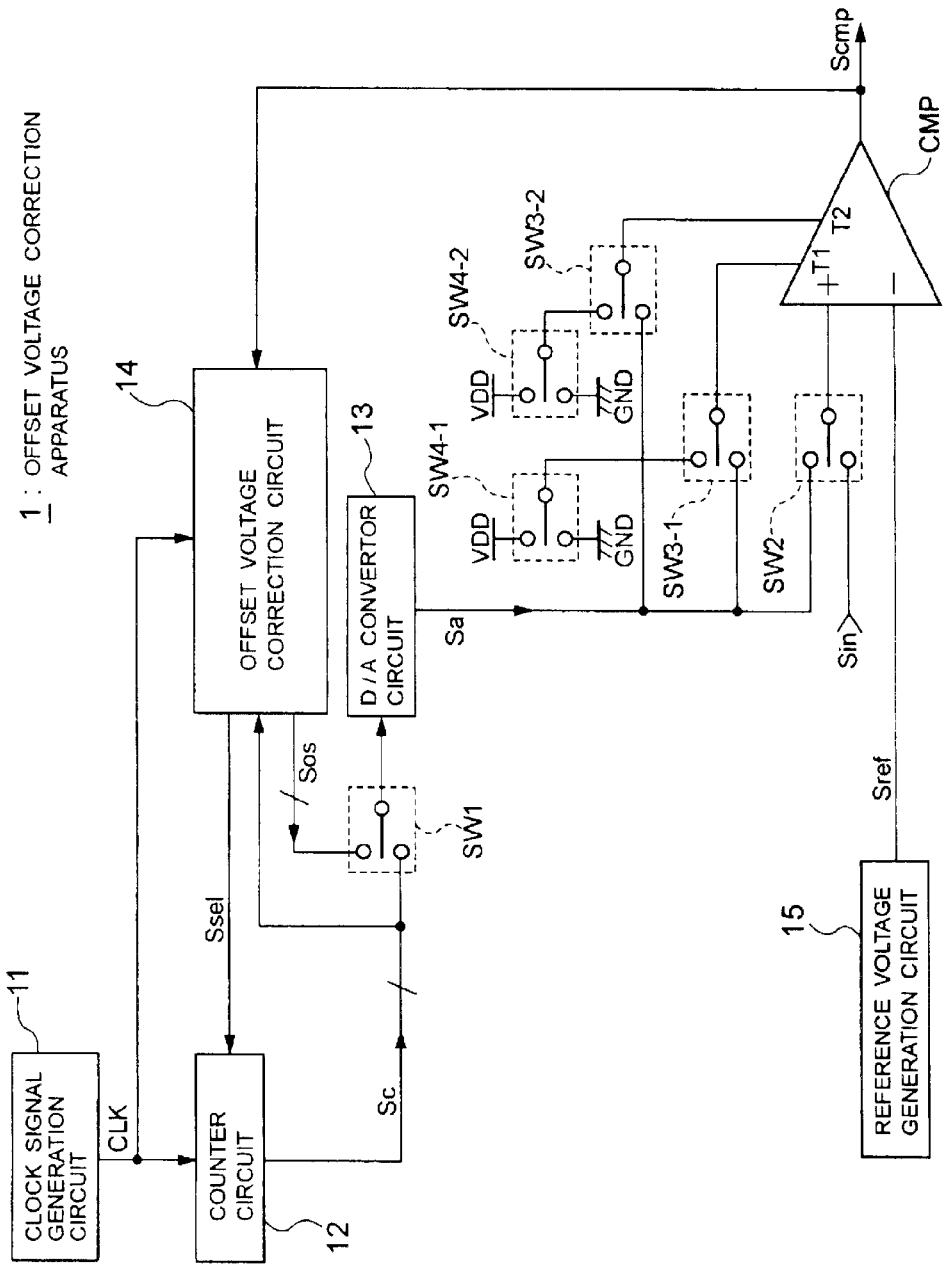
FIG. 1 is a block diagram illustrating the configuration of an offset voltage correction apparatus according to a first embodiment of the present invention.

The configuration of an offset voltage correction apparatus according to a first embodiment of the present invention is shown in FIG. 1. The offset voltage correction apparatus 1, designed to correct an input offset voltage in a comparator CMP, comprises the comparator CMP, a clock signal generation circuit 11, a counter circuit 12, a digital-to-analog (D/A) converter circuit 13, an offset voltage correction circuit 14, a reference voltage generation circuit 15, and a plurality of switches SW1, SW2, SW3-1, SW3-2, SW4-1, and SW4-2.

A clock signal CLK delivered from the clock signal generation circuit 11 is directed to the counter circuit 12 and the offset voltage correction circuit 14. The counter circuit 12 counts the clock signal CLK to yield a count value (a digital value), which is in turn directed to the switch SW1 and the offset voltage correction circuit 14 as a counter signal Sc . The counter circuit 12 also receives a select signal Ssel from the offset voltage correction circuit 14.

Figure 2:
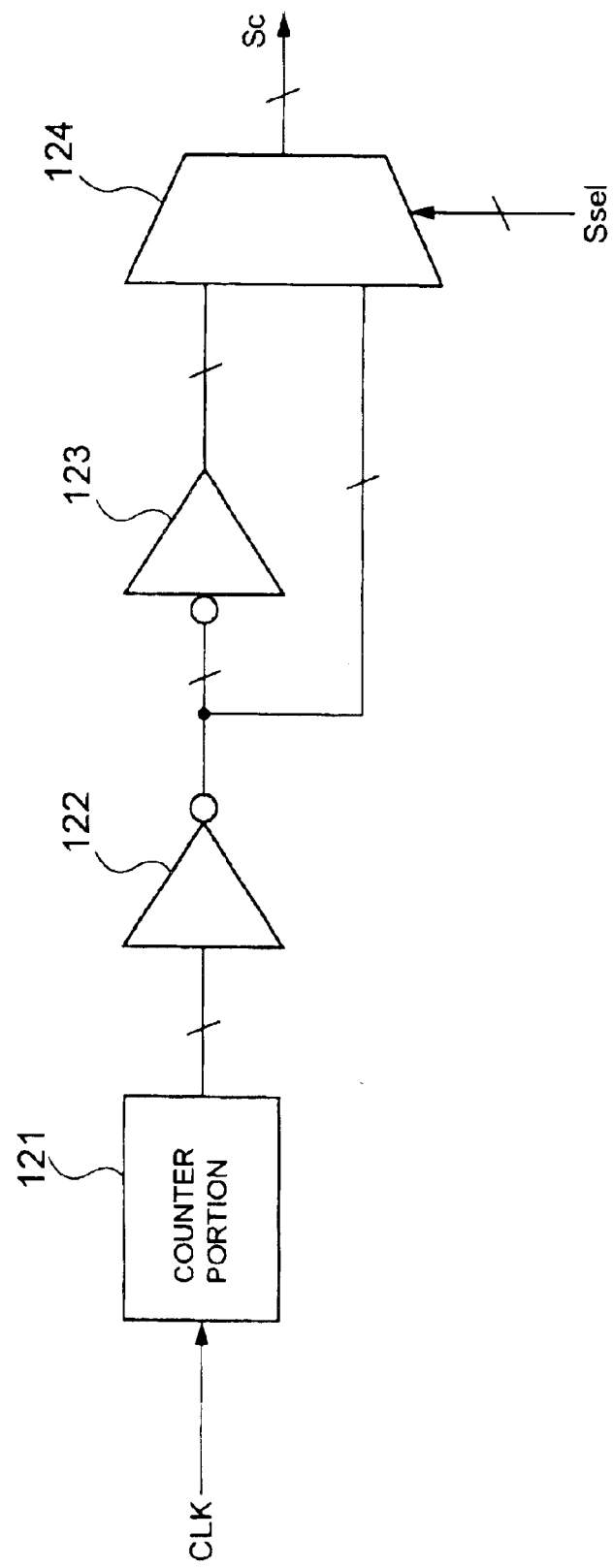
FIG. 2 is a block diagram illustrating the configuration of a counter circuit incorporated into the offset voltage correction apparatus of FIG. 1.

As shown in FIG. 2, the counter circuit 12 comprises a count part 121, two inverters 122 and 123, and a selector 124. The count part 121 counts the clock signal CLK delivered from the clock signal generation circuit 11 to yield a count value (a digital value), which is in turn directed to the inverter 122. The output terminal of the inverter 122 is connected to the input terminal of the inverter 123 and a second input terminal of the selector 124. The output terminal of the inverter 123 is connected to a first input terminal of the selector 124. The selector 124 receives the select signal Ssel delivered from the offset voltage correction circuit 14. Depending on the logic level of the select signal Ssel, the selector 124 outputs as the counter signal Sc either a signal directed to the first input terminal (a signal with the same logic as that of the output signal from the count part 121) or a signal directed to the second input terminal (a signal with each bit of the output signal from the count part 121 being inverted). In this way, the counter circuit 12 is controlled by means of the offset voltage correction circuit 14 to perform an up-count operation or a down-count operation on the clock signal CLK.

As shown in FIG. 1, the switch SW1 directs either an offset voltage correction signal Sos (a digital value) delivered from the offset voltage correction circuit 14 or the counter signal Sc (a digital value) delivered from the counter circuit 12 to the D/A converter circuit 13. The D/A converter circuit 13 converts the output signal from the switch SW1 (a digital value) to an analog signal Sa for output. The analog signal Sa is directed to the first terminal of each of the switches SW2, SW3-1, and SW3-2.

The second terminal of the switch SW2 receives an input signal Sin. The switch SW2 allows either the input signal Sin or the analog signal Sa delivered from the D/A converter circuit 13 to be delivered from a common terminal and directed to the comparator CMP.

The positive phase input terminal "+" of the comparator CMP (the second input terminal) is connected to the common terminal of the switch SW2, a first offset voltage correction terminal T1 is connected to the common terminal of the switch SW3-1, and a second offset voltage correction terminal T2 is connected to the common terminal of the switch SW3-2. In addition, the negative phase input terminal "−" (the first input terminal) of the comparator CMP receives a reference signal Sref delivered from the reference voltage generation circuit 15. The comparator CMP compares the potential at the positive phase input terminal "+" with the potential at the negative phase input terminal "−", and delivers the comparison result as a comparison signal Scmp to a circuit in a subsequent stage (not shown) and to the offset voltage correction circuit 14. The comparison signal Scmp has a digital value of "1" or "0."

The second terminal of the switch SW3-1 is connected to the common terminal of the switch SW4-1, while the second terminal of the switch SW3-2 is connected to the common terminal of the switch SW4-2. The first terminal of the switch SW4-1 is connected to a supply line of a power supply voltage VDD, while the second terminal is connected to a ground line GND. Similarly, the first terminal of the switch SW4-2 is connected to the supply line of the power supply voltage VDD, while the second terminal is connected to the ground line GND.

Figure 3:
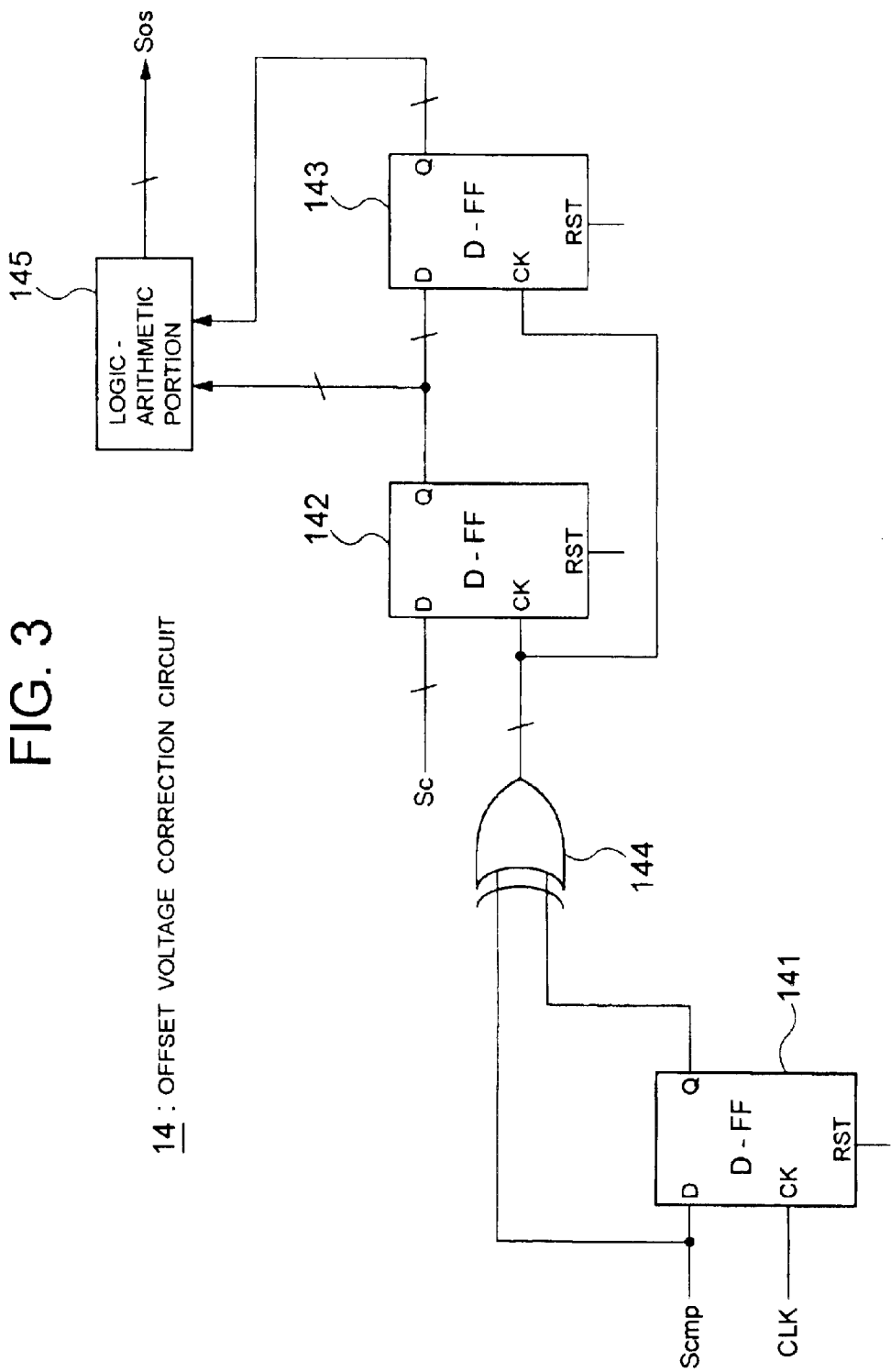
FIG. 3 is a block diagram illustrating the configuration of an offset voltage correction circuit incorporated into the offset voltage correction apparatus of FIG. 1.

The circuit configuration of the offset voltage correction circuit 14 is shown in FIG. 3. The offset voltage correction circuit 14 comprises three D flip-flops (D-FF) 141, 142, 143, an exclusive OR gate (Ex-OR gate) 144, and a logic-arithmetic part 145.

An input terminal D of the D-FF 141 receives the comparison signal Scmp delivered from the comparator CMP, while a clock signal input terminal CK of the D-FF 141 receives the clock signal CLK delivered from the clock signal generation circuit 11.

The first input terminal of the Ex-OR gate 144 is connected with an output terminal Q of the D-FF 141, while the second input terminal receives the comparison signal Scmp delivered from the comparator CMP. An output terminal of the Ex-OR gate 144 is connected to the clock signal input terminal CK of each of the D-FF 142 and the D-FF 143.

The input terminal D of the D-FF 142 receives the counter signal Sc delivered from the counter circuit 12. The output terminal Q of the D-FF 142 is connected to the input terminal D of the D-FF 143 and the logic-arithmetic part 145. The output terminal Q of the D-FF 143 is also connected to the logic-arithmetic part 145.

The logic-arithmetic part 145 performs a predetermined logic operation (discussed later) based on the data signal delivered from the output terminal Q of the D-FF 142 and the data signal delivered from the output terminal Q of the D-FF 143 to deliver the arithmetic operation result as the offset voltage correction signal Sos.

Figure 4:
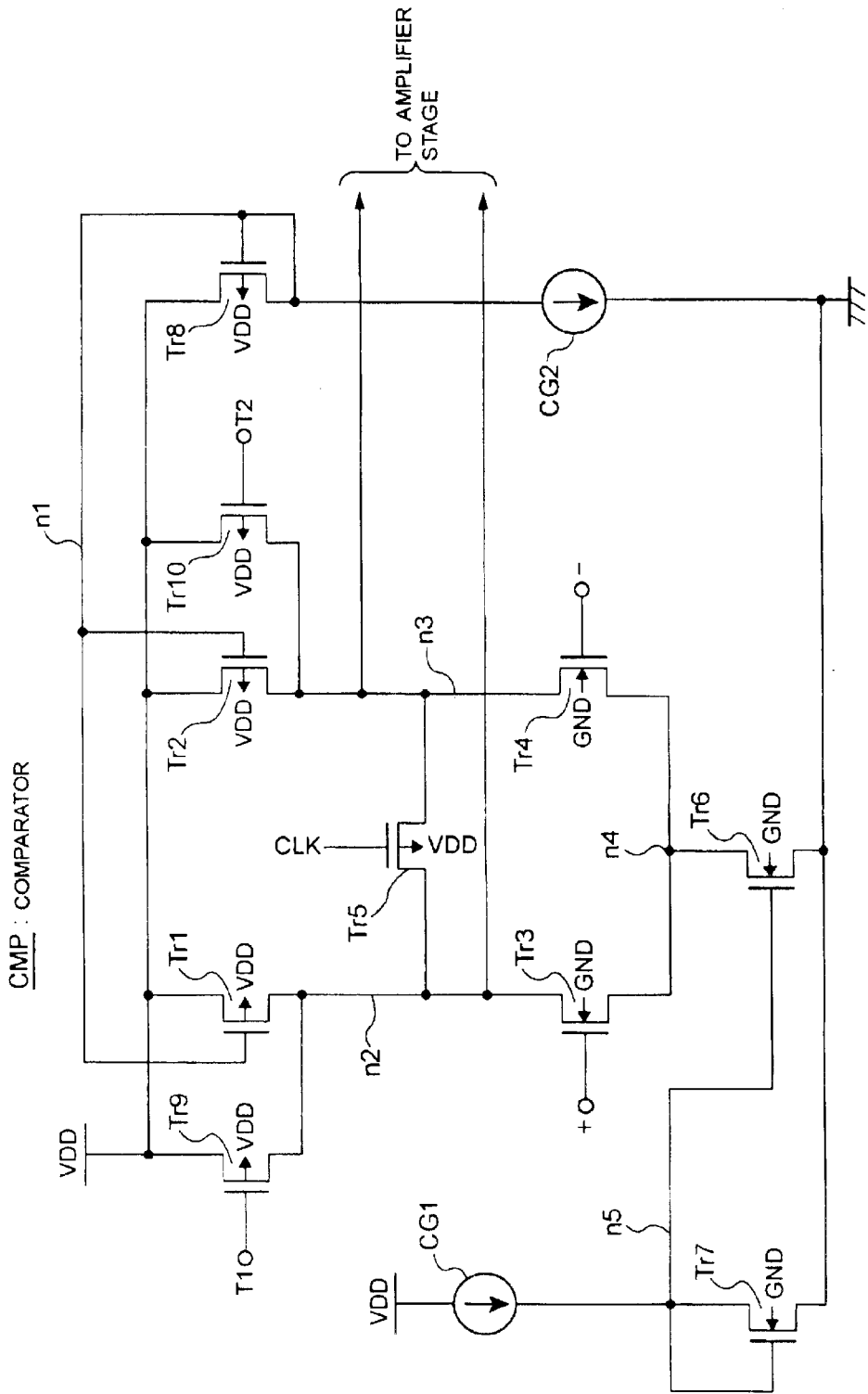
FIG. 4 is a circuit diagram illustrating the input stage of a comparator incorporated into the offset voltage correction apparatus of FIG. 1.

The circuit configuration of the comparator CMP will be described with reference to FIG. 4. FIG. 4 shows the input stage of the comparator CMP. This input stage comprises P-channel transistors (P transistors) Tr1, Tr2, Tr5, Tr8, Tr9, Tr10, N-channel transistors (N transistors) Tr3, Tr4, Tr6, Tr7, and constant-current sources CG1, CG2.

The gate of each of the P transistors Tr1, Tr2 is connected to a node n1, while each source is connected to a transmission line of the power supply voltage VDD. The source of each of the P transistors Tr8, Tr9, Tr10 is connected to the transmission line of the power supply voltage VDD. The gate of the P transistor Tr9 is connected to the first offset voltage correction terminal T1, while the gate of the P transistor Tr10 is connected to the second offset voltage correction terminal T2. The drain of the P transistors Tr1, Tr9 is connected in common to a node n2 (a first internal node), while the drain of the P transistors Tr2, Tr10 is connected in common to a node n3 (a second internal node). The gate and the drain of the P transistor Tr8 are connected in common to the node n1. The gate of the P transistor Tr5 is connected to the transmission line of the clock signal CLK, the source is connected to the node n2, and the drain is connected to the node n3. The substrate gate of each of the P transistors Tr1, Tr2, Tr5, Tr8, Tr9, Tr10 is connected to the supply line of the power supply voltage VDD.

The drain of the N transistor Tr3 is connected to the node n2, while the drain of the N transistor Tr4 is connected to the node n3. The gate of the N transistor Tr3 is connected to the positive phase input terminal "+", while the gate of the N transistor Tr4 is connected to the negative phase input terminal "−". The source of each of the N transistors Tr3, Tr4 and the drain of the N transistor Tr6 are connected in common to a node n4. The gate of the N transistor Tr6 and the drain and the gate of the N transistor Tr7 are connected to a node n5. The source of each of the N transistors Tr6, Tr7 is connected in common to the ground line GND.

An end of the anode of a constant-current source CG1 is connected to the supply line of the power supply voltage VDD, while an end of the cathode is connected to the node n5. An end of the anode of a constant-current source CG2 is connected to the node n1, while an end of the cathode is connected in common to the ground line GND.

The input stage of the comparator CMP is connected to an amplifier stage via the nodes n2 and n3.

The P transistor Tr9 (an adjuster which adjusts an offset voltage), the gate of which is connected to the first offset voltage correction terminal T1, serves to adjust the drain voltage of the N transistor Tr3. The P transistor Tr10 (an adjuster which adjusts an offset voltage), the gate of which is connected to the second offset voltage correction terminal T2, serves to adjust the drain voltage of the N transistor Tr4.

Now, the operation of the offset voltage correction apparatus 1 configured as described above according to this embodiment will be described below.

The offset voltage correction apparatus 1 detects an input offset voltage in the comparator CMP (Mode 1), and then controls the operation of the comparator CMP in accordance with the input offset voltage detected (Mode 2). This allows the comparator CMP to make a comparison with accuracy between the input signal Sin and the reference signal Sref.

In mode 1, the switch SW1 is connected to the output side of the counter circuit 12, while the switch SW2 is connected to the output side of the D/A converter circuit 13. The switch SW3-1 is connected to the common terminal side of the switch SW4-1, while the switch SW3-2 is connected to the common terminal side of the switch SW4-2. The switches SW4-1 and SW4-2 are both connected to the supply line side of the power supply voltage VDD.

The switches SW1, SW2 operate to allow the D/A converter circuit 13 to convert the counter signal Sc delivered from the counter circuit 12 to analog form. The resulting analog signal Sa is delivered to the positive phase input terminal "+" of the comparator CMP. On the other hand, the switches SW3-1, SW3-2, SW4-1, SW4-2 operate to allow the power supply voltage VDD to be applied to the first and second offset voltage correction terminals T1, T2 of the comparator CMP. Therefore, the P transistors Tr9, Tr10 constituting the input stage of the comparator CMP are both changed to the OFF state. The counter circuit 12 and the D/A converter circuit 13 constitute an offset voltage detection signal output part according to the present invention.

In mode 2, the switch SW1 is connected to the output side of the offset voltage correction circuit 14. The switch SW2 is switched so that the input signal Sin is directed to the positive phase input terminal "+" of the comparator CMP. Either the switch SW3-1 or the switch SW3-2 is connected to the output side of the D/A converter circuit 13.

The switch SW2 operates so that the input signal Sin is directed to the positive phase input terminal "+" of the comparator CMP. The switches SW1, SW3-1 (or switch SW3-2) operate so that the offset voltage correction signal Sos delivered from the offset voltage correction circuit 14 is converted to analog form in the D/A converter circuit 13. The resulting analog signal Sa (an offset voltage correction signal) is directed to the first offset voltage correction terminal T1 (or the second offset voltage correction terminal T2) of the comparator CMP. As a result, a current having a magnitude corresponding to the offset voltage correction signal Sos will flow between the drain and the source of the P transistor Tr9 or the P transistor Tr10, which constitutes the input stage of the comparator CMP. In this arrangement, the offset voltage correction circuit 14 and the D/A converter circuit 13 constitute an offset voltage correction signal generation part according to the present invention.

First, the offset voltage correction apparatus 1 may selectively operate in mode 1. In this mode 1, the comparator CMP compares the analog signal Sa (an offset voltage detection signal) generated based on the counter signal Sc delivered from the counter circuit 12 with the reference signal Sref and then outputs the comparison result as the comparison signal Scmp. The offset voltage correction circuit 14 associates the comparison signal Scmp with the counter signal Sc from which the comparison signal Scmp has been produced.

As described above, there is a difference in input offset voltage between the transition of the comparison signal Scmp delivered from the comparator CMP from "1" to "0" (where the potential at the positive phase input terminal "+" of the comparator CMP changes from a higher level to a lower level than the potential at the negative phase input terminal "−")and the transition from "0" to "1" (where the potential at the positive phase input terminal "+" of the comparator CMP changes from a lower level to a higher level than the potential at the negative phase input terminal "−"). Thus, in mode 1, the counter circuit 12 of the offset voltage correction apparatus 1 performs both the up-count operation and the down-count operation on the clock signal CLK. This allows the offset voltage correction circuit 14 to obtain a value of the counter signal Sc (a counter value CVu) corresponding to the input offset voltage provided by the transition of the comparison signal Scmp from "1" to "0" and a value of the counter signal Sc (a counter value CVd) corresponding to the input offset voltage provided by the transition of the comparison signal Scmp from "0"to "1." The offset voltage correction circuit 14 performs a predetermined arithmetic operation using the counter values CVu and CVd.

Now, the offset voltage correction apparatus 1 changes from mode 1 to mode 2. The result of the arithmetic operation in the offset voltage correction circuit 14 is delivered as the offset voltage correction signal Sos, which is then converted by the D/A converter circuit 13 to the analog signal Sa. The analog signal Sa is directed to the P transistor Tr9 or Tr10 which is incorporated into the comparator CMP.

The operation of the offset voltage correction apparatus 1 has been outlined above. Now, the operation of each part will be explained in more detail.

<Operation of Counter Circuit 12>

Figure 5:
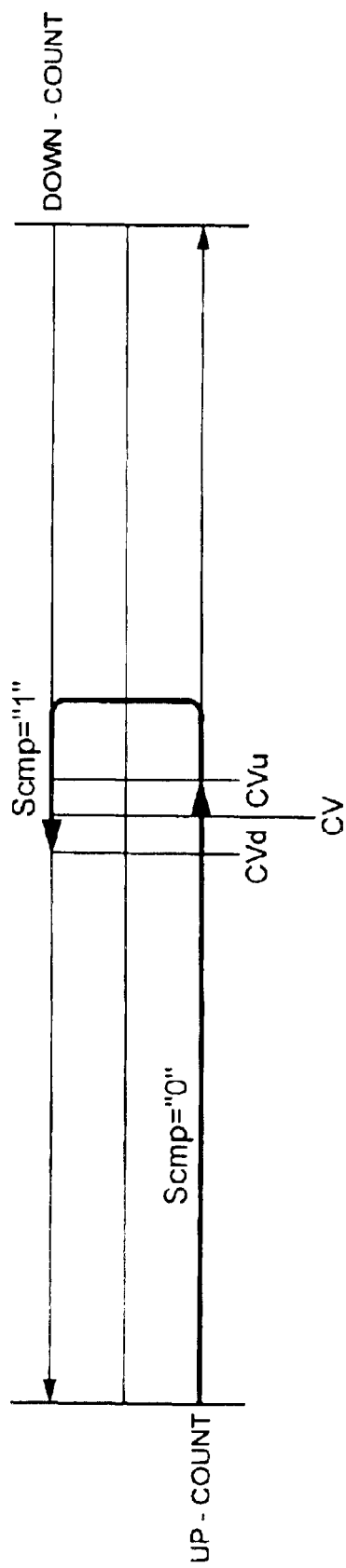
FIG. 5 is an explanatory view illustrating the operation of the counter circuit of FIG. 2 and the comparator of FIG. 4.

As shown in FIG. 5, in mode 1, the counter circuit 12 first performs the up-count operation on the clock signal CLK. Since the potential at the positive phase input terminal "+" of the comparator CMP is lower than the potential at the negative phase input terminal "−" immediately after the up-count operation has been initiated, the comparison signal Scmp delivered has a value of "0." The counter circuit 12 continues the up-count operation until the value of the comparison signal Scmp changes from "0" to "1," and thereafter changes the up-count operation into the down-count operation on the clock signal CLK. However, the counter circuit 12 does not switch the count operation immediately after the value of the comparison signal Scmp has changed from "0" to "1" but switches the count operation after having further counted at least one cycle of the clock signal CLK.

There has to be an interval of several clocks until the counter circuit 12 switches the count operation after a change has occurred in the value of the comparison signal Scmp because of the following reasons:

[Reason 1]

It is assumed that during the up-count operation of the counter circuit 12, the value of the comparison signal Scmp delivered from the comparator CMP is changed from "0" to "1" to yield a count value "Cvu," while during the down-count operation of the counter circuit 12, the value of the comparison signal Scmp delivered from the comparator CMP is changed from "1" to "0" to yield a count value "CVd." As shown in FIG. 5, the comparator CMP having a hysteresis property in terms of the output from the comparison signal Scmp causes the count value CVu and the count value CVd to be inconsistent with each other.

An interval of several clocks provided until the counter circuit 12 switches the count operation after a change has occurred in the value of the comparison signal Scmp makes it possible to positively ascertain that the count values CVu and CVd are inconsistent with each other. This in turn provides evidence that the comparator CMP has a hysteresis property.

Conventionally, only one of a voltage corresponding to the count value CVu and a voltage corresponding to the count value CVd was employed as an input offset voltage. However, according to the offset voltage correction apparatus 1 of this embodiment, a voltage corresponding to a count value CV (an arithmetic operation result counter value) intermediate between the count value CVu and the count value CVd is defined as the input offset voltage in the comparator CMP. This allows the input offset voltage to be properly corrected even when the comparator CMP has a hysteresis property.

[Reason 2]

While the comparator CMP continues to deliver the comparison signal Scmp="1" or the comparison signal Scmp="0," the Ex-OR gate 144 incorporated into the offset voltage correction circuit 14 outputs "0" in sync with the clock signal CLK. Then, the Ex-OR gate 144 delivers "1" when the logic of the comparison signal Scmp transitions from "1" to "0" or from "0" to "1."

Suppose that the counter circuit 12 switches the count operation immediately after a change has occurred in the value of the comparison signal Scmp. In this case, for example, the Ex-OR gate 144 delivers in series a signal having "1" arranged as in "00000011000000." In this case, it is impossible to determine the timing at which the changes in the comparison signal Scmp from "1" to "0" and from "0" to "1" have occurred, respectively. Additionally, one cannot deny the possibility that the logic of the comparison signal Scmp has changed only once.

Suppose that the counter circuit 12 switches the count operation two clocks after a change has occurred in the value of the comparison signal Scmp. In this case, for example, the Ex-OR gate 144 delivers in series a signal "000000101000000." That is, a "0" appears between "1" and "1." The appearance of the "0" makes it evident that the comparison signal Scmp has changed from "1" to "0" and further from "0" to "1."

However, the interval for switching the count operation of the counter circuit 12 should be set to be as short as possible on the precondition that two timings at which the comparison signal Scmp is changed can be determined with accuracy. The longer the interval, the longer the time (the period of time of mode 1) required for an offset voltage correction becomes by that amount.

In the foregoing, the operation of the counter circuit 12 has been described in connection with the case where the up-count operation is first performed followed by the down-count operation; however, the down-count operation may also be performed first.

<Operation of Offset Voltage Correction Circuit 14>

The D-FF 141 incorporated into the offset voltage correction circuit 14 delivers from the output terminal Q a signal delayed by one cycle of the clock signal CLK with respect to the comparison signal Scmp supplied to the input terminal D. The first input terminal of the Ex-OR gate 144 is connected with the output terminal Q of the D-FF 141, while the second input terminal is connected with the input terminal D of the D-FF 141. Therefore, when the first input terminal is different in potential level from the second input terminal, or at a time of transition in the logic of the comparison signal Scmp, the Ex-OR gate 144 outputs "1." In this way, the D-FF 141 and the Ex-OR gate 144 detect a transition in the logic of the comparison signal Scmp.

The output terminal of the Ex-OR gate 144 is connected to the clock signal input terminal CK of the D-FF 142. For example, suppose that the counter circuit 12 has first started from an up-count operation in mode 1. In this case, the D-FF 142 holds the value of the counter signal Sc (a count value CVu) provided at the time of a transition in the logic of the comparison signal Scmp. As described above, the counter circuit 12 switches the count operation an interval of several clocks after the logic of the comparison signal Scmp has been changed. Since the logic of the comparison signal Scmp does not change during this interval, the Ex-OR gate 144 outputs "0." Therefore, during this interval, the D-FF 142 continues to hold the count value CVu.

The down-count operation initiated by the counter circuit 12 after the interval will cause a transition to occur again in the logic of the comparison signal Scmp at certain timing. The value of the counter signal Sc (a count value CVd) provided then is acquired by the D-FF 142, while the count value CVu held by the D-FF 142 is shifted to the D-FF 143.

The aforementioned operation allows the D-FF 143 to hold the value of the counter signal Sc (e.g., the count value CVu) provided at the time of the first transition in the logic of the comparison signal Scmp, while allowing the D-FF 142 to hold the value of the counter signal Sc (e.g., the count value CVd) provided at the time of the second transition in the logic of the comparison signal Scmp.

<Configuration and Operation of Logic-arithmetic Part 145>

Figure 6:
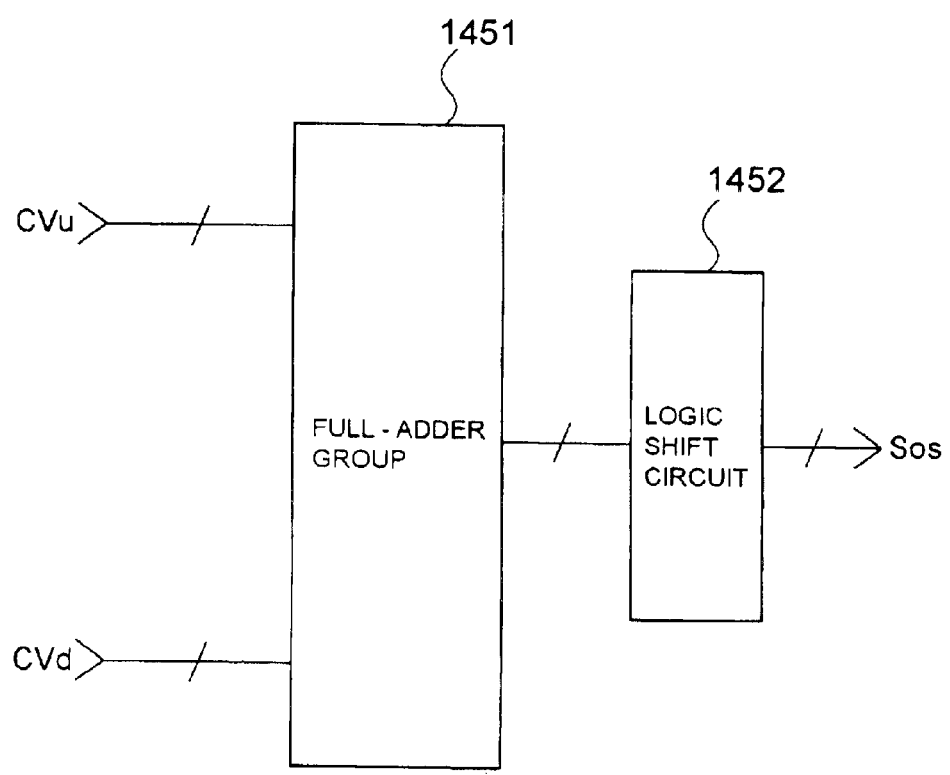
FIG. 6 is a block diagram illustrating the configuration of a logic-arithmetic part incorporated into the offset voltage correction circuit of FIG. 3.

As shown in FIG. 6, the logic-arithmetic part 145 comprises a full-adder group 1451 and a logic shift circuit 1452. The full-adder group 1451 has the number of full-adders corresponding to the bit widths of the count value CVd delivered from the D-FF 142 and the count value CVu delivered from the D-FF 143. The logic shift circuit 1452 functions to shift each bit of the operation result provided by the full-adder group 1451 by one bit towards the least significant bit.

The logic-arithmetic part 145 configured as described above determines the value (count value CV) intermediate between the count value CVu and the count value CVd. In addition, according to the offset voltage correction apparatus 1 of this embodiment, the voltage corresponding to the count value CV is defined as the input offset voltage in the comparator CMP to correct the input offset voltage in the comparator CMP. Now, a logic operation for determining the count value CV will be described below.

The logic-arithmetic part 145 treats the count value CVu and the count value CVd in binary form. The count value CVu and the count value CVd are added in the full-adder group 1451. Each bit of the resulting value is shifted by one bit toward the least significant bit in the logic shift circuit 1452. The resulting value obtained by this sift operation is a value intermediate between the count value CVu and the count value CVd or a count value CV.

Suppose that the comparator CMP is an ideal circuit. In this case, when the potentials of the comparator CMP at the positive phase input terminal "+" and the negative phase input terminal "−" become consistent with each other, a change occurs in the logic of the comparison signal Scmp delivered from the comparator CMP. However, when the comparator CMP has an input offset voltage of a negative value, a change occurs in the logic of the comparison signal Scmp delivered from the comparator CMP when the potential at the positive phase input terminal "+" has dropped by the input offset voltage relative to the potential at the negative phase input terminal "−." On the other hand, with the input offset voltage having a positive value, a change occurs in the logic of the comparison signal Scmp delivered from the comparator CMP when the potential at the positive phase input terminal "+" has increased by the input offset voltage relative to the potential at the negative phase input terminal "−".

A count value CV having the most significant bit of "1" when expressed with a two's-complement number would allow the input offset voltage in the comparator CMP to be determined to have a minus value, while a count value CV having the most significant bit of "0" allows the input offset voltage in the comparator CMP to be determined to have a plus value. The most significant bit of the count value CV can be monitored to determine whether the input offset voltage in the comparator CMP has a plus value or a minus value.

When the input offset voltage in the comparator CMP has a minus value or the count value CV has the most significant bit of "1", the logic-arithmetic part 145 inverts logically all the bits of the count value CV and adds "1" to the least significant bit, further delivering the bits other than the most significant bit as the offset voltage correction signal Sos. When the input offset voltage in the comparator CMP has a plus value or the count value CV has the most significant bit of "0," the logic-arithmetic part 145 delivers the bits of the count value CV other than the most significant bit as the offset voltage correction signal Sos.

When the offset voltage correction circuit 14 outputs the offset voltage correction signal Sos, the offset voltage correction apparatus 1 has preferably been moved from a mode (mode 1) for detecting the input offset voltage in the comparator CMP to a mode (mode 2) for controlling the operation of the comparator CMP in accordance with the input offset voltage detected.

<Operation of Switch SW1 and D/A Converter Circuit 13>

A shift from mode 1 to mode 2 causes the switch SW1 to change its connection from the output side of the counter circuit 12 to the output side of the offset voltage correction circuit 14. Accordingly, the offset voltage correction signal Sos delivered from the offset voltage correction circuit 14 is to be directed to the D/A converter circuit 13. The D/A converter circuit 13 converts the offset voltage correction signal Sos to the analog signal Sa in analog form for output.

<Operation of Switches SW2, SW4-1, SW4-2>

A shift from mode 1 to mode 2 causes the switch SW2 to change its connection so that the input signal Sin is directed to the positive phase input terminal "+" of the comparator CMP. The switches SW4-1, SW4-2 are kept connected to the supply line side of the power supply voltage VDD.

<Operation of Switches SW3-1, SW3-2>

A shift from mode 1 to mode 2 causes either the switch SW3-1 or SW3-2 to change its connection from the output side of the switch SW4-1 or the switch SW4-2 to the output side of the D/A converter circuit 13, while the other is kept connected to the output side of the switch SW4-1 or the switch SW4-2.

This connection switching operation by the switches SW3-1, SW3-2 is carried out in accordance with the value of the input offset voltage in the comparator CMP.

When the input offset voltage in the comparator CMP has a minus value, or when the count value CV has the most significant bit of "1," the switch SW3-1 is connected to the output side of the D/A converter circuit 13. This operation performed by the switch SW3-1 causes the analog signal Sa to be directed to the gate of the P transistor Tr9 via the first offset voltage correction terminal T1 of the comparator CMP. The P transistor Tr9 in the OFF state in mode 1 will allow in mode 2 a drain-source current having a value corresponding to the potential of the analog signal Sa (the value of the count value CV) to flow into the node n2, thereby causing the potential at the node n2 to increase.

In contrast to this, when the input offset voltage in the comparator CMP has a plus value, or when the count value CV has the most significant bit of "0," the switch SW3-2 is connected to the output side of the D/A converter circuit 13. This operation performed by the switch SW3-2 causes the analog signal Sa to be directed to the gate of the P transistor Tr10 via the second offset voltage correction terminal T2 of the comparator CMP. The P transistor Tr10 in the OFF state in mode 1 will allow in mode 2 a drain-source current having a value corresponding to the potential of the analog signal Sa (the value of the count value CV) to flow into the node n3, thereby causing the potential at the node n3 to increase.

Any difference in potential between the node n2 and the node n3 inside the comparator CMP would cause an input offset voltage to occur corresponding to this potential difference. Accordingly, the input offset voltage takes a minus value when the potential at the node n2 is lower than that at the node n3, whereas the input offset voltage takes a plus value when the potential at the node n3 is lower than that at the node n2.

According to the offset voltage correction apparatus 1 of this embodiment, the P transistor Tr9 or the P transistor Tr10, which is incorporated into the comparator CMP, operates corresponding to the value of the input offset voltage to be adjusted so that the potentials at the nodes n2 and n3 are equal to each other. As a result, the input offset voltage in the comparator CMP becomes substantially 0v.

The offset voltage correction apparatus 1 corrects the input offset voltage in the comparator CMP using the channel length modulation effect of the transistor. More information on the channel length modulation effect can be found in pages 25 to 45 of "CMOS Analog Circuit Design Techniques" by Atushi Iwata, published by REALIZE.

Now, a description will be given below to the process for deriving the drain current against the gate-source voltage property (Id-Vgs property) in the saturated region in MOSFET (Metal Oxide Semiconductor Field Effect Transistor) in consideration of the channel length modulation effect.

The Id-Vgs property in the saturated region in an N-channel MOSFET and the Id-Vgs property in the saturated region in a P-channel MOSFET are shown in (Eq.1) and (Eq.2), respectively.

$$Id = \frac{\beta n}{2nn} * (Vgs - V_{btn})2 * (1 + \lambda n Vds) \quad \text{(Eq. 1)}$$

$$Id = \frac{\beta p}{2np} * (-Vgs + Vthp)^2 * (1 - \lambda p Vds) \quad \text{(Eq. 2)}$$

$$\beta n = \mu n Coxn * \frac{Wn}{Ln} \quad \beta p = \mu p Coxp * \frac{Wp}{Lp}$$

$$nn = 1 + \frac{Cdn}{Coxn} \quad np = 1 + \frac{Cdp}{Coxp}$$

$$\ddot{e}n = \frac{Kdsn}{2Ln\sqrt{Vds - Vgs + \ddot{O}_0}}$$

$$\ddot{e}p = \frac{Kdsp}{2Ln\sqrt{-Vds + Vgs + \ddot{O}_0}}$$

$$Kdsn = \sqrt{\frac{2\varepsilon_s \varepsilon_0}{qN_A}} \quad Kdsp = \sqrt{\frac{2\varepsilon_s \varepsilon_0}{qN_D}}$$

where $\mu$ is the channel mobility, Cox is the capacitance of the gate oxide film, W is the gate width, L is the gate length, Cd is the capacitance of the depletion layer, Vds is the source-drain voltage, Vgs is the gate-source voltage, F0 is the built-in potential, es is the relative dielectric constant, NA is the concentration of the acceptor, and ND is the concentration of the donor.

An input offset voltage may occur in the comparator CMP due to the following two reasons.

[Cause 1] Variation in dimensions of the N transistor Tr3 and/or the N transistor Tr4

[Cause 2] Variation in dimensions of the P transistor Tr1 and/or the P transistor Tr2

Now, techniques for correcting the input offset voltage will be explained below for each of the causes 1 and 2.

<For Cause 1>

Figure 7:
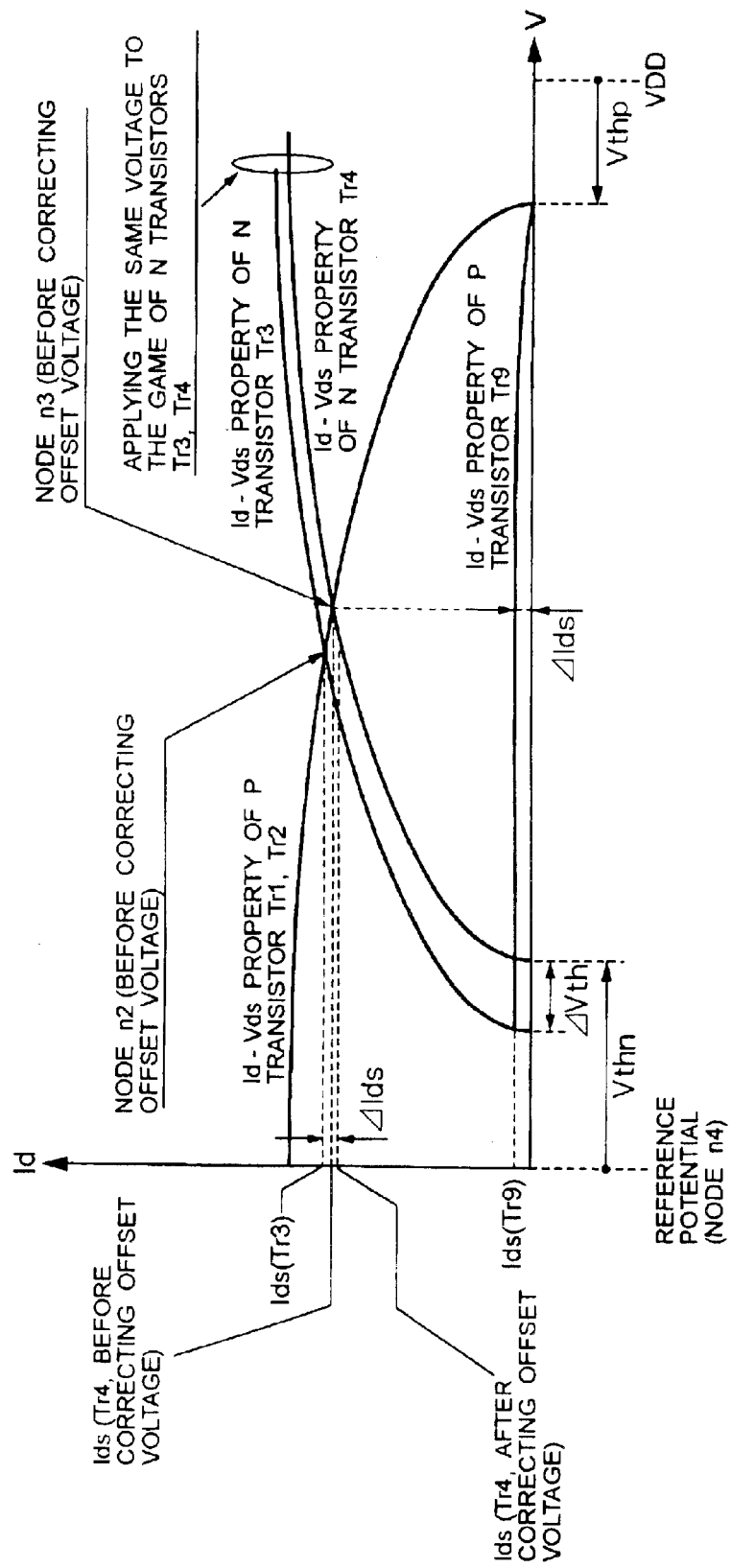
FIG. 7 is a diagram illustrating the Id-Vds characteristic curve of each transistor to describe a (first) operation of correcting an input offset voltage.

FIG. 7 illustrates the drain current against the drain-source voltage property (the Id-Vds property) of each of the transistors constituting the comparator CMP with the N transistor Tr3 having a gate shorter in length than designed. The N transistor Tr3 has a gate shorter in length than that of the N transistor Tr4 and thus its threshold voltage Vthn is smaller by ΔVth. This causes a potential difference to occur between the node n2 and the node n3.

When the potentials at the node n2 and the node n3 are consistent with each other with the same voltage being applied to the gate of the N transistors Tr3 and Tr4, the input offset voltage in the comparator CMP is at "0V." However, as shown in FIG. 7, any potential difference occurring between the node n2 and the node n3 would show that the comparator CMP has an input offset voltage.

According to the offset voltage correction apparatus 1 of this embodiment, the potentials at the node n2 and the node n3 can be made consistent with each other when the same voltage is being applied to the positive phase input terminal "+" and the negative phase input terminal "−" of the comparator CMP. This allows the input offset voltage in the comparator CMP to be corrected to "0V." Particularly, for cause 1, the offset voltage correction apparatus 1 operates so that the potential at the node n2 becomes consistent with the potential at the node n3. More specifically, the offset voltage correction apparatus 1 varies the gate voltage of the P transistor Tr9 to adjust the drain-source current Ids(9) such that the sum Ids(1, 9) of the drain-source current Ids(1) of the P transistor Tr1 and the drain-source current Ids(9) of the P transistor Tr9 becomes equal to the drain-source current Ids(3) of the N transistor Tr3.

Unlike the cause 1, when the N transistor Tr3 has a gate longer in length than designed, the potential at the node n3 is made consistent with the potential at the node n2. This allows the input offset voltage to be corrected.

<For Cause 2>

Figure 8:
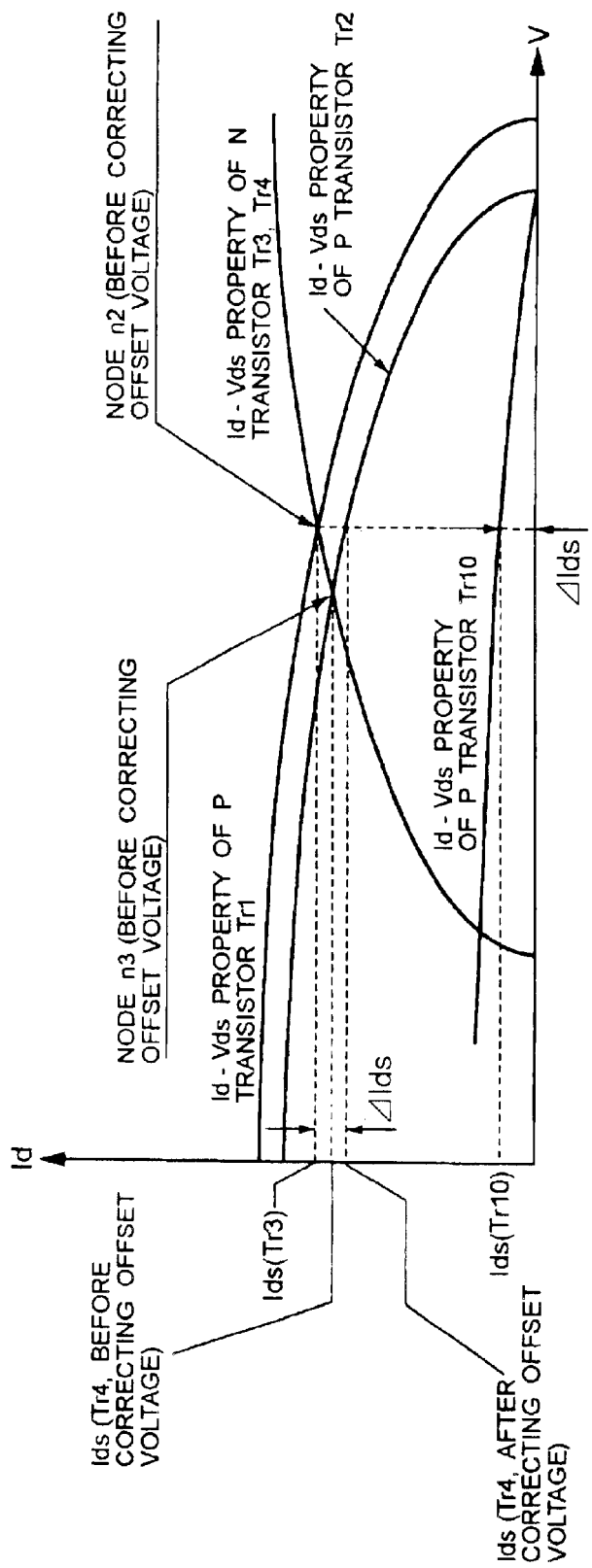
FIG. 8 is a diagram illustrating the Id-Vds characteristic curve of each transistor to describe a (second) operation of correcting an input offset voltage.

FIG. 8 illustrates the drain current against the drain-source voltage property (the Id-Vds property) of each of the transistors constituting the comparator CMP with the N transistor Tr1 having a gate shorter in length than designed. Like in the case of cause 1, the potentials at the nodes n2 and n3 are made consistent with each other when the same voltage is applied to the positive phase input terminal "+" and the negative phase input terminal "−" of the comparator CMP, thereby allowing the input offset voltage to be corrected. As a measure against the cause 2, the offset voltage correction apparatus 1 operates so that the potential at the node n2 is consistent with the potential at the node n3.

Unlike the cause 2, when the N transistor Tr1 has a gate longer in length than designed, the potential at the node n3 is made consistent with the potential at the node n2. This allows the input offset voltage to be corrected.

Now, a description is given to the state of the comparator CMP before and after the input offset voltage is corrected.

In order to correct the input offset voltage, the offset voltage correction apparatus 1 according to this embodiment associates the input offset voltage ΔVin with the drain-source current ΔIds(9) of the P transistor Tr9 or the drain-source current ΔIds (10) of the P transistor Tr10. Now, using (Eq.2) in the foregoing, operations 1 and 2 performed by the offset voltage correction apparatus 1 to correct the input offset voltage in the comparator CMP will be discussed below.

[Operation 1]

An adjustment corresponding to the input offset voltage ΔVin is made to the voltage of the reference signal Sref directed to the gate of the N transistor Tr4 via the negative phase input terminal "−" of the comparator CMP. This allows the operating point of the node n2 shown in FIG. 7 to be equal to that of the node n3.

[Operation 2]

An adjustment is made to the drain-source current Ids of the P transistor Tr9 (Ids±ΔIds). This allows the operating point of the node n2 shown in FIG. 7 to be equal to that of the node n3.

The operating points of the node n3 during operations 1 and 2 are shown in (Eq.3) and (Eq.4), respectively, with respect to the potential at the node n4 in the internal circuit of the comparator CMP (refer to FIG. 4).

$$Id = \frac{\beta_1}{2n_1} * [(Vgs + \Delta Vin) - (Vth - \Delta Vth)]^2 * (1 + \lambda_1 Vds) \quad \text{(Eq. 3)}$$

$$Id = \frac{\beta_1}{2n_1} * [Vgs - (Vth - \Delta Vth)]^2 * (1 + \lambda_0 Vds) + \Delta Ids \quad \text{(Eq. 4)}$$

where $\lambda_0$ and $\lambda_1$ are expressed by the following equations. $\lambda_1$ contains the input offset voltage ΔVin.

$$\ddot{e}_0 = \frac{Kds}{2L\sqrt{Vds - Vgs + \ddot{O}_0}}$$

$$\ddot{e}_1 = \frac{Kds}{2L\sqrt{Vds - (Vgs + \Delta Vin) + \ddot{O}_0}}$$

Since the operating point of the node n3 (Id, Vds) is the same for (Eq.3) and (Eq.4), the relation between ΔVin and ΔIds can be expressed by (Eq.5).

$$\frac{\beta_1}{2n_1}[(Vgs + \Delta Vin) - (Vth - \Delta Vth)]^2 (1 + \lambda_1 ds) = \qquad (Eq. 5)$$

$$\frac{\beta_1}{2n_1}[(Vgs - (Vth - \Delta Vth)]^2 (1 + \lambda_0 Vds) + \Delta Ids$$

Since Vgs >>ΔVin, an approximation can be made such that $\lambda_0 \approx \lambda_1$. Thus, (Eq.5) can be rewritten as (Eq.6).

$$\frac{2n_1 \Delta Ids}{\beta_1(1 + \lambda_0 Vds)} = \Delta Vin[\Delta Vin + 2(Vgs - Vth + \Delta Vth)] \qquad (Eq. 6)$$

Furthermore, since the N transistors Tr3, Tr4 and P transistor Tr2 operate in a saturated region (see FIG. 7), the relationship ΔVin <<Vgs−Vth+ΔVth holds. Accordingly, (Eq.6) can be rewritten as (Eq.7).

$$\frac{n_1 \Delta Ids}{\beta_1(1 + \lambda_0 Vds)(Vgs - Vth + \Delta Vth)} = \Delta Vin \qquad (Eq. 7)$$

In (Eq.7), the following relation can be regarded as a proportional constant to say that ΔIds and ΔVin are in a proportional relationship.

$$\frac{n_1}{\beta_1(1 + \lambda_0 Vds)(Vgs - Vth + \Delta Vth)}$$

(Eq.8) representing the relation between the gate voltage Vgs of the P transistor Tr9 in the comparator CMP having a corrected input offset voltage and the drain-source current (an amount of adjustment) ΔIds is derived from (Eq.2) with respect to the potential at the node n4 in the internal circuit of the comparator CMP (refer to FIGS. 4 and 7).

$$\Delta Ids = \frac{\beta p}{2np} * (-Vgs + Vthp)^2 * (1 - \lambda p Vds) \qquad (Eq. 8)$$

The current flowing through the P transistor Tr9 is sufficiently smaller than the current flowing through the P transistor Tr1. This allows a far less channel length modulation effect to be exerted on the P transistor Tr9 than on the P transistor Tr1. Therefore, in (Eq.8), an approximation can be made such that $\lambda_p=0$. As a result, the voltage Vgs applied to the gate of the P transistor Tr9 is expressed by (Eq.9).

$$Vgs = Vthp - \sqrt{\frac{2np \Delta Ids}{\beta p}} \quad Vthp < 0 \qquad (Eq. 9)$$

(Eq.6) can be rearranged to give (Eq.10).

$$A = \frac{\beta_1(1 + \lambda_0 Vds)(Vgs - Vth + \Delta Vth)}{n_1}$$

Substituting (Eq.10) into (Eq.9) gives (Eq.11).

$$Vgs = Vthp - \sqrt{\frac{2np A \Delta Vin}{\beta p}} \qquad (Eq. 11)$$

In accordance with (Eq.11), the input offset voltage in the comparator CMP is corrected. ΔVin is a function of ΔVth, both being smaller than Vth. Therefore, expressing AΔVin of (Eq.11) with the Maclaurin's polynomials allows Vgs to be expressed with a linear function of ΔVin as shown by (Eq.12).

$$Vgs = Va + b \Delta Vin \qquad (Eq. 12)$$

where Va is the intercept of the linear function and b is the slope.

(Eq.12) is a so-called empirical equation corresponding to a theoretical equation (Eq.11). (Eq.12) can be implemented by matching the output median value provided by the D/A converter circuit 13.

[Second Embodiment]

Figure 9:
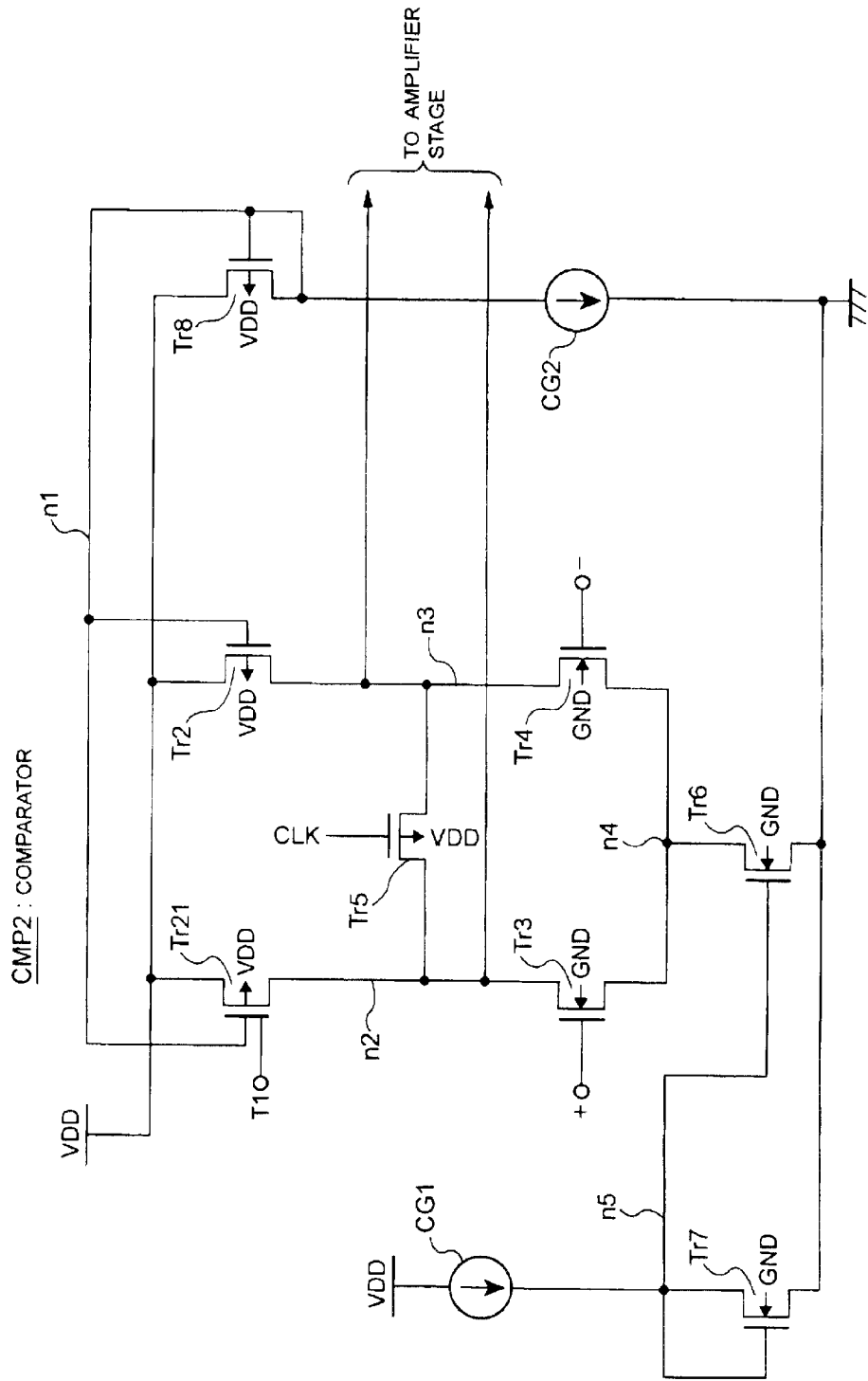
FIG. 9 is a circuit diagram illustrating the input stage of a (first) comparator in an offset voltage correction apparatus according to a second embodiment of the present invention.

An offset voltage correction apparatus according to a second embodiment of the present invention is different from the offset voltage correction apparatus 1 according to the first embodiment in replacing the comparator CMP by a comparator CMP2. The circuit configuration of the comparator CMP2 is shown in FIG. 9.

In comparison with the comparator CMP, the comparator CMP2 is arranged such that a P transistor Tr21 (a first and second internal node potential control device) replaces the P transistors Tr1 and Tr9, and the P transistor Tr10 is eliminated.

Figure 10:
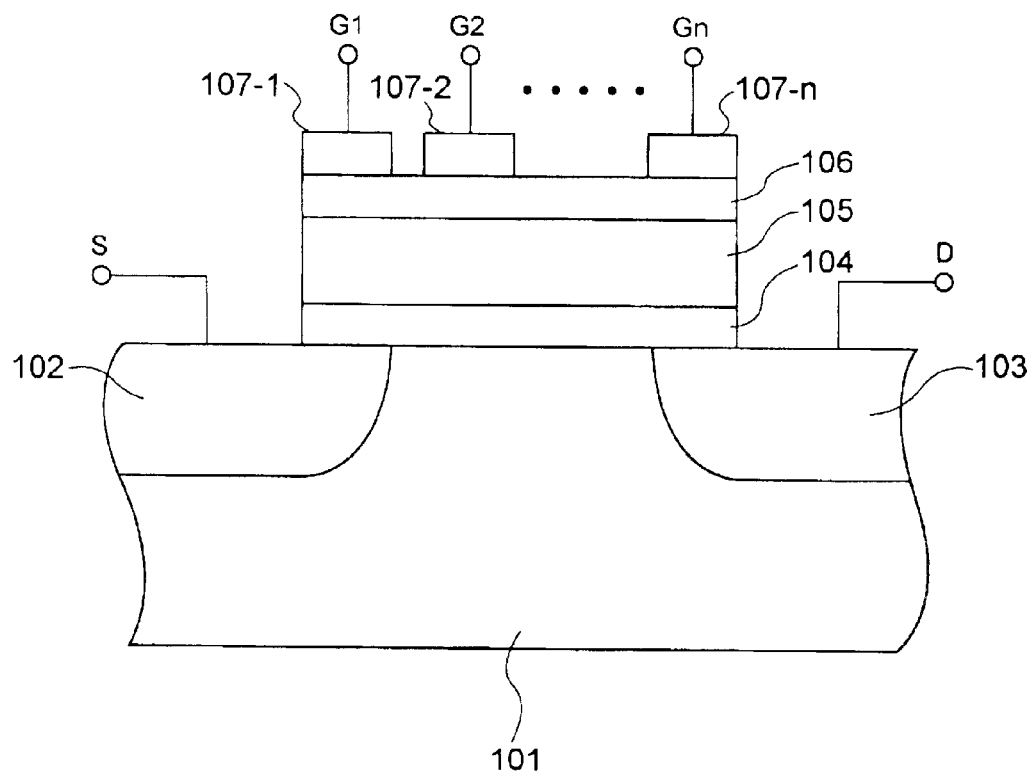
FIG. 10 is a view illustrating the structure of a neuron MOS transistor.

As the P transistor Tr21, employed is a neuron MOS transistor having two gates. The neuron MOS transistor will be described with reference to FIG. 10.

Like a typical MOS transistor, the neuron MOS transistor comprises a source region 102 and a drain region 103 in a semiconductor substrate 101. The structural difference between the two lies in the gate part. That is, the neuron MOS transistor has a floating gate film 105 sandwiched between a lower insulating layer 104 and an upper insulating layer 106, and a plurality of gates 107-1, 107-2, . . . , 107-n.

Although a typical MOS transistor can handle only digital signals for input and output, the neuron MOS transistor can employ an analog signal, a multi-valued signal, or a digital signal, as an input signal. The neuron MOS transistor can also be used to form a source follower circuit, thereby providing a multi-valued signal for output. The neuron MOS transistor having such a feature can be employed to implement a more complicated circuit function with a less number of transistors. This is evident from the comparison of the comparator CMP shown in FIG. 4 with the comparator CMP2 shown in FIG. 9. The comparator CMP2 has two less component transistors than the comparator CMP. Additionally, since the comparator CMP2 has no P transistor Tr10, the second offset voltage correction terminal T2 and the switches SW3-2, SW4-2 connected thereto are not necessary.

The neuron MOS transistor is employed for the comparator CMP2, thereby providing the following functional advantages. In the case of the neuron MOS transistor, the threshold voltage can be adjusted to thereby control either the positive or negative drain-source current Ids. This allows only one neuron MOS transistor to be provided to correct an input offset voltage even when the input offset voltage takes either a positive or negative value. In the offset voltage correction apparatus 1 according to the first embodiment, the node n2 or the node n3 is at an operating point at which a large current flows when the input offset voltage is being corrected. In contrast to this, the offset voltage correction apparatus according to the second embodiment allows the input offset voltage to be corrected with the current being kept reduced and constant. It is thus possible to correct the input offset voltage under a reduced power consumption.

Figure 11:
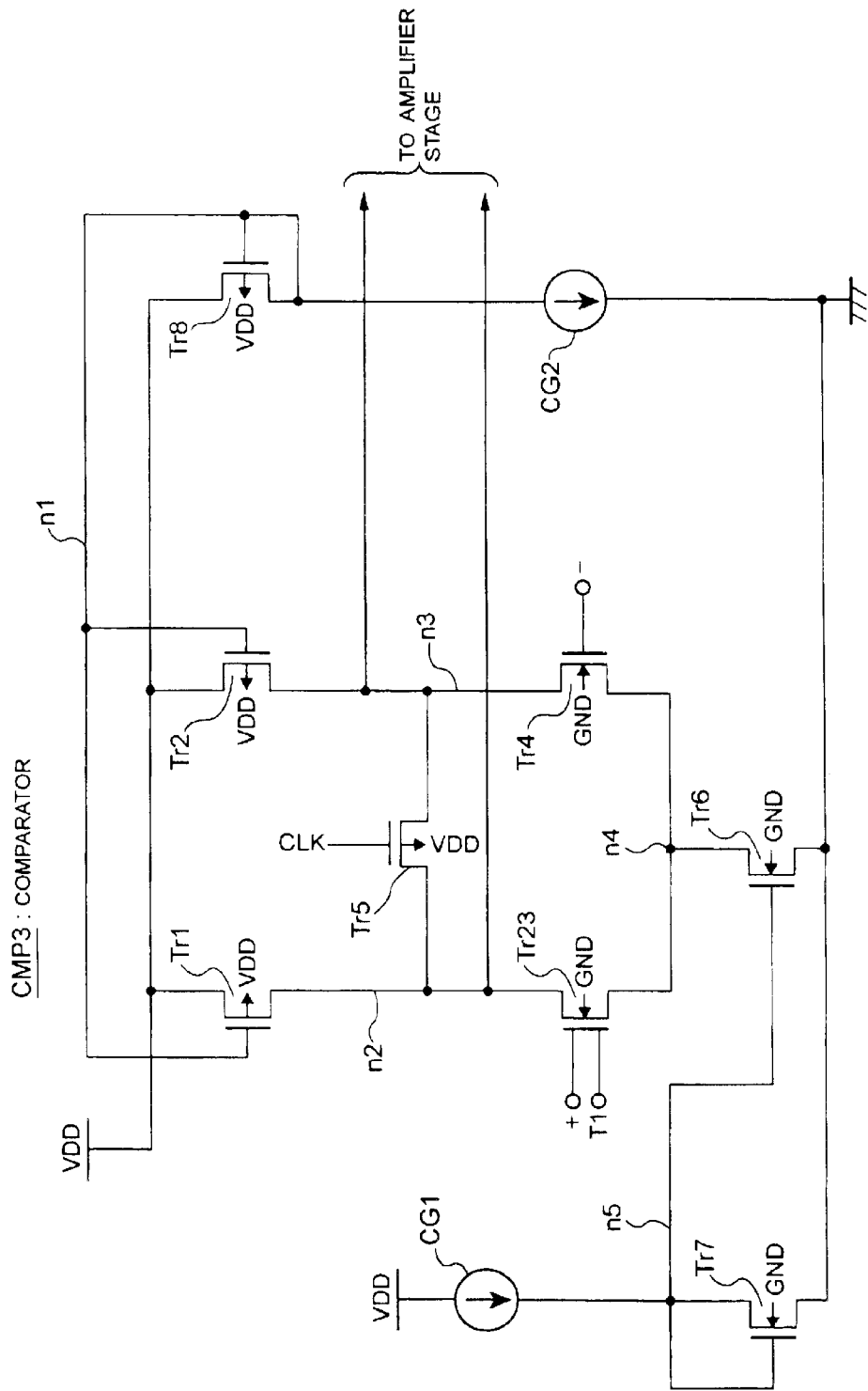
FIG. 11 is a circuit diagram illustrating the input stage of a (second) comparator in the offset voltage correction apparatus according to the second embodiment of the present invention.

The comparator CMP2 comprises a P-channel neuron MOS transistor (the P transistor Tr21), but may also employ an N-channel neuron MOS transistor in place of the P-channel neuron MOS transistor. FIG. 11 shows the circuit configuration of a comparator CMP3 having an N-channel neuron MOS transistor.

The comparator CMP3 is different from the comparator CMP incorporated into the offset voltage correction apparatus 1 according to the first embodiment in that the P transistors Tr9, Tr10 are eliminated and the N transistor Tr3 is replaced by an N transistor Tr23 (an N-channel neuron MOS transistor). The comparator CMP3 also provides the same effect as that provided by the comparator CMP2.

According to the embodiments described above, there also is provided a method for correcting an offset voltage in a comparator circuit with a first internal node having a potential varied in response to a potential at a first input terminal and with a second internal node having a potential varied in response to a potential at a second input terminal. The comparator circuit compares the potential at the first internal node with the potential at the second internal node to output a comparison result as a comparison result signal.

The method comprises the following first to sixth steps.

The first step pertains to sequentially converting a count value obtained through an up-count operation on a clock signal to an offset voltage detection signal. The second step pertains to continually providing the offset voltage detection signal obtained in the first step to the second input terminal of the comparator circuit having a reference signal directed to the first input terminal. The third step pertains to stopping the up-count operation on the clock signal a predetermined period of time after a change has occurred in logic level of the comparison result signal delivered from the comparator circuit, and starting a down-count operation on the clock signal with respect to a count value provided at that point in time to sequentially convert a count value obtained through the down-count operation to an offset voltage detection signal. The fourth step pertains to continually providing the offset voltage detection signal obtained in the third step to the second input terminal of the comparator circuit having a reference signal directed to the first input terminal. The fifth step pertains to performing a predetermined arithmetic operation, using a count value provided when a change has occurred in logic level of the comparison result signal in the second step and a count value provided when a change has occurred in logic level of the comparison result signal in the fourth step, to generate an offset voltage correction signal in accordance with an arithmetic operation result counter value obtained by the arithmetic operation. The sixth step pertains to adjusting the potential at any one of the first internal node and the second internal node in accordance with the offset voltage correction signal.

In the above-described method for correcting an offset voltage, there is a mode in which the arithmetic operation result counter value is an average value of a count value provided when a change has occurred in logic level of the comparison result signal in the second step and a count value provided when a change has occurred in logic level of the comparison result signal in the fourth step.

According to the embodiments described above, there also is provided a method for correcting an offset voltage in a comparator circuit with a first internal node having a potential varied in response to a potential at a first input terminal and with a second internal node having a potential varied in response to a potential at a second input terminal. The comparator circuit compares the potential at the first internal node with the potential at the second internal node to output a comparison result as a comparison result signal.

The method comprises the following first to sixth steps.

The first step pertains to sequentially converting a count value obtained through a down-count operation on a clock signal to an offset voltage detection signal. The second step pertains to continually providing the offset voltage detection signal obtained in the first step to the second input terminal of the comparator circuit having a reference signal directed to the first input terminal. The third step pertains to stopping the down-count operation on the clock signal a predetermined period of time after a change has occurred in logic level of the comparison result signal delivered from the comparator circuit, and starting an up-count operation on the clock signal with respect to a count value provided at that point in time to sequentially convert a count value obtained through the down-count operation to an offset voltage detection signal. The fourth step pertains to continually providing the offset voltage detection signal obtained in the third step to the second input terminal of the comparator circuit having a reference signal directed to the first input terminal. The fifth step pertains to performing a predetermined arithmetic operation, using a count value provided when a change has occurred in logic level of the comparison result signal in the second step and a count value provided when a change has occurred in logic level of the comparison result signal in the fourth step, to generate an offset voltage correction signal in accordance with an arithmetic operation result counter value obtained by the arithmetic operation. The sixth step pertains to adjusting the potential at any one of the first internal node and the second internal node in accordance with the offset voltage correction signal.

In the above-described method for correcting an offset voltage, there is a mode in which the arithmetic operation result counter value is an average value of a count value provided when a change has occurred in logic level of the comparison result signal in the second step and a count value provided when a change has occurred in logic level of the comparison result signal in the fourth step.

Although the present invention has been explained in accordance with the preferred embodiments with reference to the accompanying drawings, the present invention is not limited to those embodiments. It is evident to those skilled in the art that various modifications and changes may be made within the scope and spirit of the attached claims. It is therefore to be understood that those modifications and changes also fall within the scope and spirit of the present invention.

As described above, the present invention makes it possible to correct an input offset voltage in a comparator circuit with very high accuracy. The scale of the circuit for correcting the input offset voltage can also be reduced. The power consumption required for the correction operation is also reduced.

What is claimed is:

1. An offset voltage correction apparatus comprising:
 a comparator circuit with a first internal node having a potential varied in response to a potential at a first input terminal and with a second internal node having a potential varied in response to a potential at a second input terminal, said comparator circuit comparing the potential at said first internal node with the potential at said second internal node to output a comparison result as a comparison result signal;
 an offset voltage detection signal output part sequentially converting a counter value obtained through an up-count operation and a down-count operation on a clock signal to an offset voltage detection signal to provide the offset voltage detection signal to said second input terminal of said comparator circuit having a reference signal directed to said first input terminal;

an offset voltage correction signal generator performing a predetermined arithmetic operation, in which a counter value provided when a change has occurred in logic level of said comparison result signal during the up-count operation on said clock signal by said offset voltage detection signal output part and a counter value provided when a change has occurred in logic level of said comparison result signal during the down-count operation on the clock signal by said offset voltage detection signal output part are used, generating an offset voltage correction signal in accordance with an arithmetic operation result counter value obtained by the arithmetic operation; and an offset voltage adjuster adjusting any one of the potential at said first internal node and the potential at said second internal node in accordance with said offset voltage correction signal.

2. The offset voltage correction apparatus according to claim 1, wherein said offset voltage adjuster comprises a control terminal receiving said offset voltage correction signal, a first power supply terminal connected to a power supply node, and a transistor having a second power supply terminal connected to any one of said first internal node and said second internal node.

3. The offset voltage correction apparatus according to claim 1, wherein said offset voltage adjuster is contained in a first internal node potential control device, to control the potential at said first internal node in response to the potential at said first input terminal, and said first internal node potential control device comprises:

a first control terminal connected to said first input terminal;

a second control terminal receiving said offset voltage correction signal;

a first power supply terminal connected to a power supply node; and a transistor having a second power supply terminal connected to said first internal node.

4. The offset voltage correction apparatus according to claim 1, wherein said offset voltage adjuster is contained in a second internal node potential control device, to control the potential at said second internal node in response to the potential at said second input terminal, and said second internal node potential control device comprises:

a first control terminal connected to said second input terminal;

a second control terminal receiving said offset voltage correction signal;

a first power supply terminal connected to a power supply node; and a transistor having a second power supply terminal connected to said second internal node.

5. The offset voltage correction apparatus according to claim 1, wherein said arithmetic operation result counter value is an average value of a counter value provided when a change has occurred in logic level of said comparison result signal during the up-count operation on said clock signal by said offset voltage detection signal output part and a counter value provided when a change has occurred in logic level of said comparison result signal during the down-count operation on said clock signal by said offset voltage detection signal output part.

6. The offset voltage correction apparatus according to claim 2, wherein said arithmetic operation result counter value is an average value of a counter value provided when a change has occurred in logic level of said comparison result signal during the up-count operation on said clock signal by said offset voltage detection signal output part and a counter value provided when a change has occurred in logic level of said comparison result signal during the down-count operation on said clock signal by said offset voltage detection signal output part.

7. The offset voltage correction apparatus according to claim 3, wherein said arithmetic operation result counter value is an average value of a counter value provided when a change has occurred in logic level of said comparison result signal during the up-count operation on said clock signal by said offset voltage detection signal output part and a counter value provided when a change has occurred in logic level of said comparison result signal during the down-count operation on said clock signal by said offset voltage detection signal output part.

8. The offset voltage correction apparatus according to claim 4, wherein said arithmetic operation result counter value is an average value of a counter value provided when a change has occurred in logic level of said comparison result signal during the up-count operation on said clock signal by said offset voltage detection signal output part and a counter value provided when a change has occurred in logic level of said comparison result signal during the down-count operation on said clock signal by said offset voltage detection signal output part.

9. An offset voltage correction apparatus comprising:

a comparator circuit with a first internal node having a potential varied in response to a potential at a first input terminal and with a second internal node having a potential varied in response to a potential at a second input terminal, said comparator circuit comparing the potential at said first internal node with the potential at said second internal node to output a comparison result as a comparison result signal;

offset voltage detection signal output means for sequentially converting a counter value obtained through an up-count operation and a down-count operation on a clock signal to an offset voltage detection signal to provide the offset voltage detection signal to said second input terminal of said comparator circuit having a reference signal directed to said first input terminal;

offset voltage correction signal generation means for performing a predetermined arithmetic operation, using a counter value provided when a change has occurred in logic level of said comparison result signal during the up-count operation on said clock signal by said offset voltage detection signal output means and using a counter value provided when a change has occurred in logic level of said comparison result signal during the down-count operation on said clock signal by said offset voltage detection signal output means, to generate an offset voltage correction signal in accordance with an arithmetic operation result counter value obtained by the arithmetic operation; and offset voltage adjustment means for adjusting any one of the potential at said first internal node and the potential at said second internal node in accordance with said offset voltage correction signal.

10. The offset voltage correction apparatus according to claim 9, wherein said offset voltage adjustment means comprises a control terminal for receiving said offset voltage correction signal, a first power supply terminal connected to a power supply node, and a transistor having a second power supply terminal connected to any one of said first internal node and said second internal node.

11. The offset voltage correction apparatus according to claim 9, wherein said offset voltage adjustment means is contained in first internal node potential control means for controlling the potential at said first internal node in response to the potential at said first input terminal, and said first internal node potential control means comprises:

a first control terminal connected to said first input terminal;

a second control terminal for receiving said offset voltage correction signal;

a first power supply terminal connected to a power supply node; and a transistor having a second power supply terminal connected to said first internal node.

12. The offset voltage correction apparatus according to claim 9, wherein said offset voltage adjustment means is contained in second internal node potential control means for controlling the potential at said second internal node in response to the potential at said second input terminal, and said second internal node potential control means comprises:

a first control terminal connected to said second input terminal;

a second control terminal for receiving said offset voltage correction signal;

a first power supply terminal connected to a power supply node; and a transistor having a second power supply terminal connected to said second internal node.

13. The offset voltage correction apparatus according to claim 9, wherein said arithmetic operation result counter value is an average value of a counter value provided when a change has occurred in logic level of said comparison result signal during the up-count operation on said clock signal by said offset voltage detection signal output means and a counter value provided when a change has occurred in logic level of said comparison result signal during the down-count operation on said clock signal by said offset voltage detection signal output means.

14. The offset voltage correction apparatus according to claim 10, wherein said arithmetic operation result counter value is an average value of a counter value provided when a change has occurred in logic level of said comparison result signal during the up-count operation on said clock signal by said offset voltage detection signal output means and a counter value provided when a change has occurred in logic level of said comparison result signal during the down-count operation on said clock signal by said offset voltage detection signal output means.

15. The offset voltage correction apparatus according to claim 11, wherein said arithmetic operation result counter value is an average value of a counter value provided when a change has occurred in logic level of said comparison result signal during the up-count operation on said clock signal by said offset voltage detection signal output means and a counter value provided when a change has occurred in logic level of said comparison result signal during the down-count operation on said clock signal by said offset voltage detection signal output means.

16. The offset voltage correction apparatus according to claim 12, wherein said arithmetic operation result counter value is an average value of a counter value provided when a change has occurred in logic level of said comparison result signal during the up-count operation on said clock signal by said offset voltage detection signal output means and a counter value provided when a change has occurred in logic level of said comparison result signal during the down-count operation on said clock signal by said offset voltage detection signal output means.

* * * * *